(12) United States Patent
Konrad et al.

(10) Patent No.: US 7,087,441 B2
(45) Date of Patent: Aug. 8, 2006

(54) METHOD OF MAKING A CIRCUITIZED SUBSTRATE HAVING A PLURALITY OF SOLDER CONNECTION SITES THEREON

(75) Inventors: John J. Konrad, Endicott, NY (US); Joseph A. Kotylo, Binghamton, NY (US); Jose A. Rios, Binghamton, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 98 days.

(21) Appl. No.: 10/968,929

(22) Filed: Oct. 21, 2004

(65) Prior Publication Data

US 2006/0099727 A1    May 11, 2006

(51) Int. Cl.
*G01R 31/26* (2006.01)
*H01L 21/66* (2006.01)

(52) U.S. Cl. ................ 438/14; 438/597; 438/622

(58) Field of Classification Search ............... 438/14, 438/597, 612, 614, 622
See application file for complete search history.

(56) References Cited

U.S. PATENT DOCUMENTS

| | | |
|---|---|---|
| 4,487,654 A | 12/1984 | Coppin |
| 4,745,004 A | 5/1988 | Schwerin |
| 4,958,588 A | 9/1990 | Hutchison et al. |
| 4,978,423 A | 12/1990 | Durnwirth, Jr. et al. |
| 5,130,164 A | 7/1992 | Hutchison et al. |
| 5,398,865 A | 3/1995 | Mittag |
| 5,597,469 A | 1/1997 | Carey et al. |
| 5,672,260 A | 9/1997 | Carey et al. |
| 5,863,812 A | 1/1999 | Manteghi |
| 5,873,511 A | 2/1999 | Shapiro |
| 6,022,466 A | 2/2000 | Tamarkin et al. |
| 6,044,550 A | 4/2000 | Larson |
| 6,378,199 B1 | 4/2002 | Yoshinuma et al. |
| 6,586,683 B1 | 7/2003 | Arrington et al. |
| 6,645,841 B1 | 11/2003 | Kever |
| 6,767,616 B1 * | 7/2004 | Ooi et al. ........... 428/209 |

* cited by examiner

*Primary Examiner*—Phuc T. Dang
(74) *Attorney, Agent, or Firm*—Hinman, Howard & Kattell, LLP; Lawrence R. Fraley

(57) ABSTRACT

A method of making a circuitized substrate in which two solder deposits, either of the same or different metallurgies, are formed on at least two different metal or metal alloy conductors and PTHs. In an alternative embodiment, the same solder compositions may be deposited on conductor and PTHs of different metal or metal alloy composition. In each embodiment, a single commoning layer (e.g., copper) is used, being partially removed following the first deposition. The solder is deposited using an electroplating process (electroless or electrolytic) and the commoning bar in both depositing steps. An information handling system utilizing the circuitized substrate formed in accordance with the invention is also described.

52 Claims, 4 Drawing Sheets

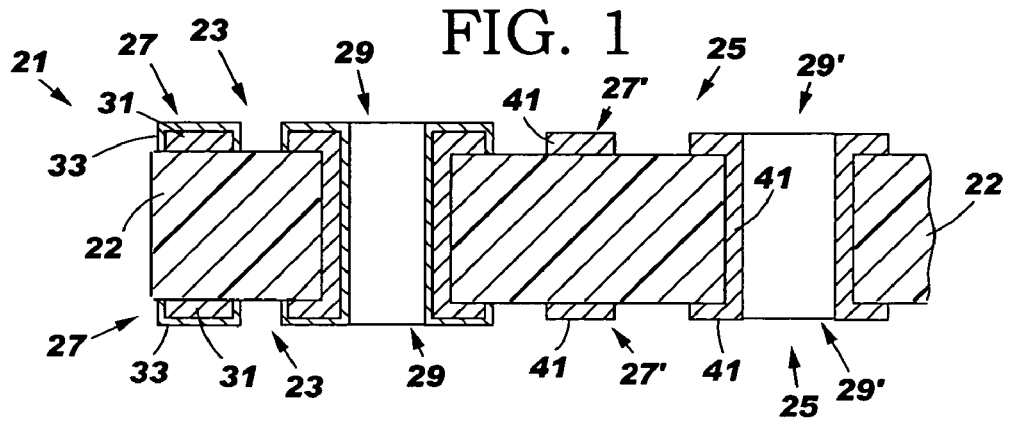
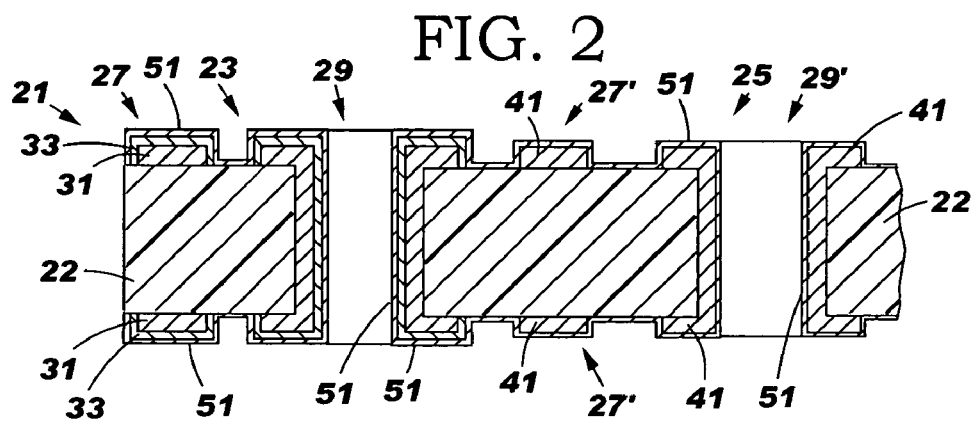
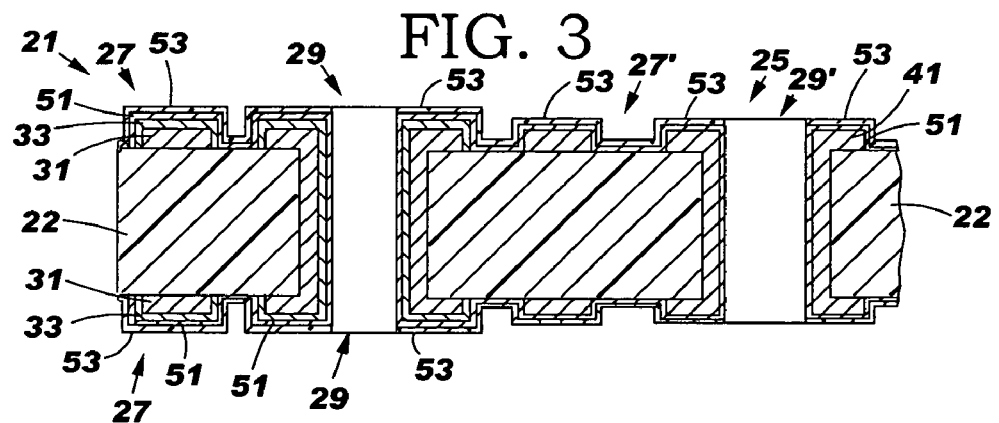
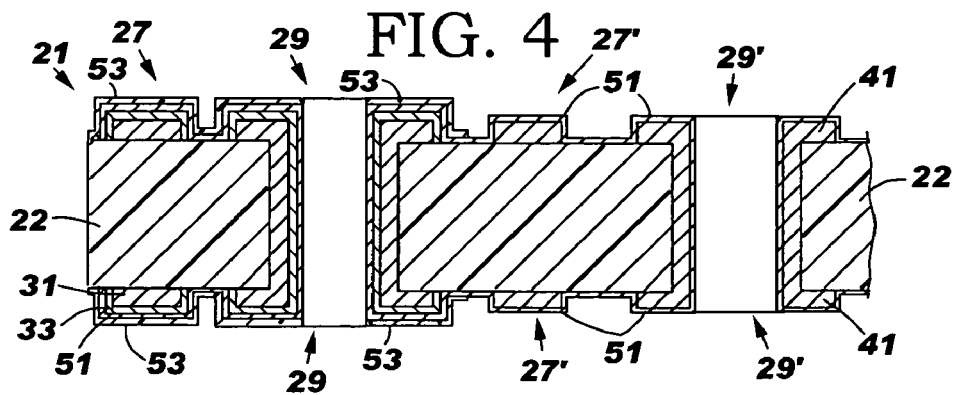

METHOD OF MAKING A CIRCUITIZED SUBSTRATE HAVING A PLURALITY OF SOLDER CONNECTION SITES THEREON

TECHNICAL FIELD

The present invention relates to forming solder connections for coupling electronic components onto circuitized substrates such as printed circuit boards (or cards) and chip carriers. The invention is particularly related to such solder connections which are of high density and extremely small in size. Further, the invention is related to electrical assemblies such as information handling systems adapted for using such circuitized substrates.

BACKGROUND OF THE INVENTION

Soldering is a well known process for forming electrical connections between electronic components such as semi-conductor chips, chip carriers, modules, resistors, capacitors, etc. and the electrically conductive pads (or sites) on the external surface of circuitized substrates such as printed circuit boards and chip carriers. Several different forms of such processes have evolved over the years, including, e.g., wave soldering wherein a printed circuit board, populated with such components, is passed over a crest of a molten solder wave, immersion wave soldering in which a conventional solder wave submerged in a heated flux bath is utilized, and vapor phase reflow soldering which utilizes the latent heat of vaporization stored in a saturated vapor of inert fluorinated organic compounds (e.g., Fluorinert). Additional description of various solder processes is provided hereinbelow.

Today's electronics industry demands many products, particularly those utilizing circuitized substrates, to be of smaller size, as the trend toward smaller components and higher integration densities of integrated circuits continues. Customers want smaller computers, calculators, printers, telephones, etc., all with increased functional capabilities. To meet these demands, manufacturers of circuitized substrates must develop new processes for the successful (quick, relatively inexpensive, and adaptable to mass production) application of solder to extremely small areas and in carefully controlled volumes. To make such processes all the more complex, the resulting connections must not be so close as to allow solder "bridging" between adjacent connections.

One widely used technique, particularly for direct attachment of a semiconductor chip, chip carrier or like components onto a board or module, is surface mount technology. One form of such technology utilizes what are referred to as solder "pre-forms", possibly including a desired flux, for application to locations where solder connections are to be made. Such pre-forms are formed (solidified) solder elements which are positioned on the designated substrate pads and which are then heated (re-flowed) once the components are in place, until solidification once again occurs and the final couplings (connections) realized. Use of solder pre-forms has proven relatively successful for forming solder connections at small sizes and close spacings since the volume of solder contained in each pre-form can be controlled in a relatively accurate manner. However, the minimum size of such pre-forms is limited to sizes which can be efficiently handled by automated placement equipment and does not answer current needs for many electronic package manufacturing applications.

Another known process is the use of pulverized solder material in a viscous binder in the form of a paste which can be applied by stenciling. While this process has been largely successful in applying solder to locations having sizes and spacings smaller than those where solder pre-forms are used, the accuracy with which the dispensed volume of solder can be controlled is limited by the stenciling process utilized. Because of the relatively harsh (primarily high temperatures) conditions associated with soldering, stenciling presents drawbacks due to the possibility of contamination, wear and damage to the stenciling masks through which the paste is extruded. Irregular solder paste deposition can result in one or more connections not being achieved, resulting in possible scrapping and/or re-working of the completed final product (e.g., a printed circuit board having several components mounted thereon), a very costly and therefore undesirable result. Irregularities of solder paste distribution may also be caused by the separation of the stencil mask from the substrate surface onto which the solder paste is being deposited. Still further, the minimum size of particles used for the solder material which can be formed is limited by the process by which the particles themselves are formed. That is, particles of smaller size are typically formed by atomization and solidification of liquid solder, causing an increase in the ratio of surface area-to-volume as size decreases, in turn causing an increase in oxide-to-metal volume for a fixed thickness of oxide on the surface of the particle and a greater viscosity of the paste for a given metal loading of the paste having the particles. Lowering metal loading and viscosity, in turn, requires a thicker stencil to obtain the desired volume of metal with higher aspect ratio openings, which is contrary to the normal and desirable operating requirements for stencils in order to accommodate small feature sizes since high aspect ratio stencil openings (and high viscosity) reduce the ability of the paste to release from the stencil. Thus, there is a trade-off between process complexities and requirements which limits the deposit size and stenciling resolution which can be achieved and control of the locations to which either the paste or the solder, itself, may flow. Still further, solder stenciling processes and the processes for fabrication of masks through which stenciling is done do not support the close spacing or fine pitch of solder connection locations which can be formed by photo-lithographic technologies which are typically utilized as part of the circuit defining process. Registration of the mask with connection locations also becomes difficult when extremely close spacing of connections is required.

It is also known that, in the process of making a solder connection to a copper conductor (copper being one of the most widely used metals for substrate pads, lines, etc of a substrate's circuit pattern), some copper is typically removed from the pad and becomes part of the solder connection material. This may become critical in some applications in microelectronic manufacturing, particularly in devices which are subjected to high temperature operation and thermal cycling, since tin-copper inter-metallic compound precipitates may be formed (that is, when tin is part of the solder composition as is also well known for most solders). Further, the solubility of copper in typical solder materials is very small and on the order of 0.3%. Therefore, most excess copper in the solder materials will be in the form of such inter-metallic compounds. Inappropriate amounts of copper in the solder material may degrade the reflow characteristics of the solder. Specifically, when conductors are closely spaced, it is desirable that the solder "pulls back" toward the conductor (pad) on which the connection is made and away from adjacent conductors.

This action also maximizes the conductive material in the connection and provides for a stable configuration of the solder material even when softened by normal or abnormal temperatures after the final substrate product is put into service (e.g., as part of a computer). Such reflow may also be adversely affected by small amounts of copper on the surrounding substrate, allowing such areas to be partially wetted or bridged. Perhaps the best solution known at the present time is to dissolve such copper deposits in the solder (which is often difficult due to the relatively low solubility of copper in solder materials, especially when the conductor also provides a source of copper solute in the solder material), is to react the copper from the solder with other materials, or use aggressive fluxes. These "solutions" typically mandate longer reflow times and may even compromise the integrity of the resulting, formed solder connection. Other materials, such as gold, are also known to have low solubility in solder and exhibit similar adverse effects on solder connections and reflow. One particularly desirable aspect of the instant invention is that it is capable of forming solder couplings in which some tin and/or copper from the site may be incorporated within the solder composition in satisfactory amounts which will not adversely affect the resulting connections formed.

In U.S. Pat. No. 4,487,654 (Coppin), there is described a method of manufacturing a printed circuit board utilizing a solder mask over bare copper for circuit traces and ground planes. The method includes the step of electroplating a very thin coating of tin-lead over the circuit traces, ground planes, holes and circuit pads prior to selectively coating only the pads and holes with a relatively thick coating of tin-lead solder plate. After removing the plating resist which defines the areas for selective solder coating, the board is chemically etched and then mechanically scrubbed to roughen the surface of and reduce the thickness of the thin solder plate. A solder mask may be applied over circuit traces and ground planes prior to reflowing the thick coating of solder plate. Assembled printed circuit boards are then wave soldered.

In U.S. Pat. No. 4,745,004 (Schwerin), there is described a method and apparatus for transporting work through a series of work processing stations by moving the work along a path extending past the stations to successive positions along the path opposite the stations, respectively, and at each position extending and retracting the work into and from the respective station for processing of the work therein. The method and apparatus are designed to coat or plate the conductors and thru-holes of printed circuit boards with solder by mounting the circuit boards in rack-like work holders, transporting the work holders in succession from an feed station to a release station along a path extending over a series of tanks containing liquid baths of acid, rinse solution, flux, solder/oil and final wash, respectively, and extending and retracting each work holder downwardly into and upwardly from each tank to successively clean, rinse, flux, solder coat and wash the circuit boards.

In U.S. Pat. No. 4,958,588 (Hutchison et al), there is described an apparatus (fixture) for solder-coating respective end portions of elongated components in a molten solder bath. This fixture includes a supporting wall capable of maintaining the fixture afloat on an upper surface of the molten solder bath when the fixture is fully loaded. The supporting wall has an opening through which one of the end portions of a component passes into the molten solder bath to a depth necessary for the molten solder to coat the respective end portion to the desired extent. The fixture may be used in conjunction with a handling device which advantageously includes two pin-shaped projections that engage the fixture at two locations spaced along a horizontal axis with freedom of movement of the fixture relative to the projections at least in the upward direction in that the projections are received in respective vertical slots of the fixture. These projections are then moved at least downwardly to an extent necessary to lower the fixture onto the upper surface of the molten bath and then release the fixture for free floating on the upper surface of the molten solder bath.

In U.S. Pat. No. 4,978,423 (Durnwirth, Jr. et al), there is described a method of providing solder on selected portions of a printed circuit board. Solder is first electroplated over copper conductor patterns on the board by means of a first photoresist layer. After stripping the first photoresist, a second photoresist layer is laminated over the board and developed to expose selected portions of the solder. The exposed portions are selectively stripped. The copper exposed by the selective stripping is then subjected to a scrubbing while the photoresist protects the remaining solder. The second photoresist is then removed.

In U.S. Pat. No. 5,130,164 (Hutchison et al), there is described a method for solder-coating respective end portions of elongated components in a molten solder bath. This method includes maintaining a fixture afloat in a predetermined position on an upper surface of a molten solder bath when the fixture is fully loaded. End portions of a respective component pass into the molten solder bath to a depth necessary for the molten solder to coat the portions to the desired extent. This patent is a divisional of U.S. Pat. No. 4,958,588 above.

In U.S. Pat. No. 5,398,865 (Mittag), there is described an apparatus and process which prepares surfaces on components, boards and the like for assembly and solder joining. Oxides and other coatings are removed from the surfaces to be soldered without having to solder coat the surfaces prior to joining. A composition of a polymer and an activator is applied to the surfaces, the polymer being thermally de-polymerizable. The composition claims to remove oxides from the surfaces. The surfaces are heated after application of the polymer and activator to de-polymerize the polymer. Solder is then applied to solder join the surfaces.

In U.S. Pat. No. 5,597,469 (Carey et al), there is described a process in which small, closely spaced deposits of solder materials may be formed by depositing a layer of conductive material over surfaces of a dielectric layer having apertures or recesses (e.g. blind apertures) and conductors and/or pads exposed by those apertures or recesses, masking regions of the conductive material with a further patterned dielectric layer, electroplating solder materials onto regions of the conductive material exposed by the mask, removing the mask and portions of the conductive material by selective etching, and thereafter reflowing solder away from at least a portion of the surfaces of the apertured dielectric layer. Fluid jet sparging and cathode agitation are also utilized. Excess conductor material in the resulting solder deposit is allegedly avoided by replacing conductor material with a constituent component of a solder material in an immersion bath prior to the electroplating step of the process.

In U.S. Pat. No. 5,672,260 (Carey et al), a continuation of U.S. Pat. No. 5,597,469 above, there is described method of forming solder deposits on a solder wettable material which includes the steps of electroplating solder materials onto portions of a conductive layer on a first layer of non-solder wettable material having apertures therein and covering a portion of the solder wettable material. Portions of the conductive layer are exposed during the electroplating by additional apertures in a second layer of non-solder wettable material, these additional apertures having dimensions sized to define a volume of solder material to be deposited by the electroplating step. The deposited solder materials are then reflowed away from a portion of the surfaces of the first layer of non-solder wettable material.

In U.S. Pat. No. 5,863,812 (Manteghi), there is described a method for fabricating a chip size package which includes the step of forming a laminated substrate which consists of a dielectric layer and a highly conductive layer disposed thereon. Holes are drilled into the dielectric layer. A desired pattern is applied to the conductive layer. A chip structure is formed which consists of a silicon die and an insulating layer disposed thereon. Gold bumps are applied to the top surface of the bonding pads. The laminated substrate is bonded to the chip structure via the holes and gold bumps. A solder mask is applied over the top surface of the conductive layer of the laminated substrate so as to form selective solder areas. Finally, solder balls are attached to the selective solder areas.

In U.S. Pat. No. 5,873,511 (Shapiro), the placement of solder "balls" in a ball grid array package is accomplished by placing a solder strip in contact with the top surface of the ball grid array carrier. The pulsing of a laser directed at the solder in discrete positions permits the transfer of the solder to the gold "dot", of an array of "dots", on the carrier in registry with the laser output when activated. Selective solder placement is possible and increasingly higher throughput is achieved by the use of laser diode bars or optical fiber fans to effect solder transfer to a plurality of dots of the array simultaneously. The entire process is described as capable of being automated by making the solder strip continuous through a recycling station arranged along a path along which the solder strip moves to the position where the carrier and the solder strip are moved into juxtaposition. The use of a transparent strip with a pattern of holes filled with solder paste permits easy transfer of the solder to the gold dots or islands on the carrier in registry with laser beam.

In U.S. Pat. No. 6,022,466 (Tamarakin et al), there is described a process for plating gold on a multi-layered printed circuit board. In one embodiment, first copper features for plating gold thereon and second copper features for plating copper thereon are selected on the board's external surface. The first copper features are internally connected to the second copper features. An etch-resist on the first and second copper features is deposited. The second copper features are masked, while a region containing the first copper features is exposed. Copper from the region is etched. The etch-resist on the first copper features is removed. Gold is then plated on the first copper features.

In U.S. Pat. No. 6,044,550 (Larson), there is described process for producing printed circuit boards which utilizes the steps of drilling holes in a copper clad laminate, applying an imaged etch resist to an outer surface of the copper clad laminate, contacting the copper clad laminate with an etchant for copper to create circuit "elements" on the copper clad laminate having the imaged etch resist applied thereon, activating the holes to accept plating therein, stripping away the imaged etch resist, applying an imaged plating mask to the surface of the copper clad laminate, and contacting the copper clad laminate with a plating solution which plates a metal coating in the holes.

In U.S. Pat. No. 6,586,683 (Arrington), there is described method of fabricating a printed circuit board which includes an electrically insulating substrate, and first, second, and third sets of conductors formed on a top surface of the substrate. The method includes forming an oxide layer on one set of conductors, forming a solder mask on the oxide layer, forming a composite layer on another set of conductors, and forming a solder layer on at least a portion of the remaining set of conductors. A commoning bar is used as part of the method. The patent mentions that the conductors may be of different metallurgies.

In U.S. Pat. No. 6,378,199 (Yoshinuma), there is described a multi-layer printed-wiring board including a substrate having a plurality of wiring pattern layers sequentially transferred thereon, each wiring pattern layer containing an electrically conductive layer and an electrically insulating layer. The wiring pattern layers are attached to the substrate through an electrically insulating layer.

In U.S. Pat. No. 6,645,841 (Kever), there is described the selective application of solder "bumps" in an integrated circuit package. These solder bumps are selectively applied in a solder bump integrated circuit packaging process so that portions of a circuit can be effectively disabled. The bumps may be selectively applied either to a die or to the substrate using multiple solder masks, one for each pattern of solder bumps desired, or these can be otherwise applied in multiple patterns depending upon which portions of the circuitry are to be active and which are to be disabled.

As will be understood from the following, the present invention provides a new and unique process for making circuitized substrates such as chip carriers and printed circuit boards in which a singular conductive layer serves as a commoning layer for the plating of solder onto two different conductor (namely pads and thru-holes) metallurgies in two separate steps, thereby eliminating the need for additional steps to provide dual plated solder applications while assuring optimal solder metallurgical matching for corresponding conductor metallurgies.

It is believed that such a process represents a significant advancement in the circuitized substrate art.

OBJECTS AND SUMMARY OF THE INVENTION

It is, therefore, a primary object of the present invention to enhance the circuitized substrate art.

It is another object of the present invention to provide a new and unique method for plating solder materials onto two different metal conductors of a circuitized substrate using a singular commoning layer formed on the substrate.

It is yet another object of the invention to provide such a method which is capable of providing such solder plating on conductors in a high density pattern.

It is still another object of the invention to provide such a method which can be successfully performed using conventional circuitized substrate manufacturing apparatus in a expeditious manner, thereby assuring cost savings are possible for the products produced using this method.

It is yet another object of the invention to provide a method of forming solder connections at sizes and spacings comparable to current photo-lithography processes.

It is another further object of the invention to provide resulting solder connections which possess stable shapes, even at elevated temperatures.

According to one aspect of the invention, there is provided a method of making a circuitized substrate which comprises providing a substrate including at least one dielectric layer, providing first and second conductors on the dielectric layer of the substrate and first and second PTHs within the dielectric layer, forming a conductive commoning layer on the substrate over the first and second conductors and PTHs and also the dielectric layer, depositing a first quantity of solder material on the first conductor and first PTH using an electro-plating process utilizing the commoning layer, and thereafter depositing a second quantity of solder material on the second conductor and second PTH using an electro-plating process also utilizing the same commoning layer.

According to another aspect of the invention, there is provided a method of making a circuitized substrate comprising providing a substrate including at least one dielectric layer, providing first and second conductors on the dielectric layer and first and second PTHs within the dielectric layer, the first conductor and first PTH of the same metal or metal alloy as the second conductor and second PTH, forming a conductive commoning layer on the substrate over the first and second conductors and PTHs and dielectric layer, depositing a first quantity of solder material on the first conductor and first PTH using an electro-plating process utilizing the commoning layer, and thereafter depositing a second quantity of solder material of a different metallurgy than the first quantity of solder on the second conductor and second PTH using an electro-plating process also utilizing the same commoning layer.

BRIEF DESCRIPTION OF THE DRAWINGS

FIGS. 1–13 illustrate the various steps of making a circuitized substrate according to one embodiment of the invention, including forming an electrical assembly in which at least one electrical component is mounted on the formed circuitized substrate.

BEST MODE FOR CARRYING OUT THE INVENTION

Figure 5:
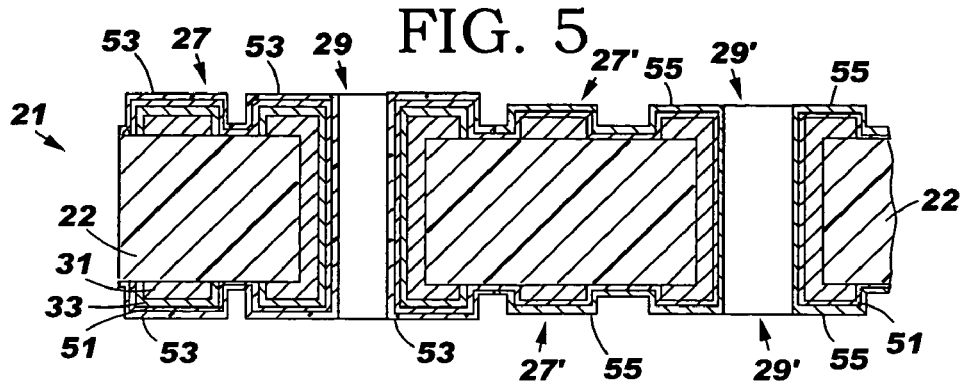

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

By the term "conductor" as used herein is meant a metal pad, line (sometimes referred to in the art as a "trace") or similar member located on the surface of a substrate and adapted for having solder material applied thereto such that a solder connection may be formed between the pad, line or similar member and another electrically conductive element such as a solder ball associated with a chip or chip carrier.

By the term "PTH" as used herein is meant a hole, opening, aperture or the like formed within a substrate of the type defined herein and adapted for conducting electricity, e.g., so as to couple a surface mounted electrical component on the substrate with one or more conductive layers, e.g., signal layers, residing within and/or externally of the substrate. A "PTH" as so defined herein may extend substantially through the entire substrate thickness or, alternatively only to a predetermined depth within the substrate. Such PTHs to only a predetermined depth are also referred to in the industry as "blind vias." Two processes are preferably used to form these openings, one being to use a laser (for the highest density formations) directed onto the dielectric substrate material using conventional PCB equipment, and the other being to use mechanical drills, also known in the art.

By the term "electro-plating" as used herein is meant to include both electroless (also referred to as electro-less) and electrolytic (also referred to as electro-lytic) plating methodologies, or a combination of various aspects of both. As known, such processing in its simplest form involves passing electrical current from an anode through an electrolyte to bring positive ions of the plating metal to a cathode. It is then joined with negative electrons created by the cathode and transforms into the metal coating. The metal coating bonds to the cathode and thus the electroplating process is complete. The theory of such plating can be explained in a simple formula:

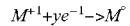

$$M^{+1} + ye^{-1} \rightarrow M^{\circ}$$

wherein M stands for the plating metal (the M charge changes with each type of metal), and y equals the number of electrons needed to cancel out the charge. These combined make the final metal coating or M(degree).

By the term "circuitized substrate" as used herein is meant to include substrates having at least one (and preferably more) dielectric layer(s) and at least one (and preferably more) metallurgical conductive layer(s), and, a plurality (at least two but preferably many more) of PTHs therein. In many cases, as mentioned, such substrates will preferably include several dielectric, conductive layers and PTHs. Examples include structures made of dielectric materials such as fiberglass-reinforced epoxy resins (some referred to as "FR-4" dielectric materials in the art), polytetrafluoroethylene (Teflon), polyimides, polyamides, cyanate resins, photoimageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. Further examples will be described in greater detail herein-below. If the dielectric materials for the structure are of a photoimageable material, it is photoimaged or photo-patterned, and developed to reveal the desired circuit pattern, including the desired opening(s) as defined herein, if required. The dielectric material may be curtain-coated or screen-applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about 2 mils to about 4 mils thick, but also thicker if desired. Examples of circuitized substrates include printed circuit boards (or cards) and chip carriers when the afore-mentioned fiberglass-reinforced epoxy resins, polytetrafluoroethylene (Teflon), polyimides, polyamides, cyanate resins and photoimageable materials are used as the dielectric material. It is believed that the teachings of the instant invention are also applicable to what are known as "flex" circuits (which use dielectric materials such as polyimide) and those which use ceramic or other non-polymer type dielectric layers, one example of the latter being what are referred to as multi-layered ceramic (MLC) modules adapted for having one or more semiconductor chips mounted thereon.

By the term "electrical component" as used herein is meant components such as semiconductor chips, resistors, capacitors and the like, which are adapted for being positioned on the external conductive surfaces of such substrates as PCBs and possibly electrically coupled to other components, as well as to each other, using, for example the PCB's internal and/or external circuitry.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) having several external components such as resistors, capacitors, modules (including one or more chip carriers) etc. mounted thereon and coupled to the internal circuitry of the PCB.

Referring to the drawings, FIGS. 1–13 show a sequence of partial, cross-sectional views illustrating various steps for making a circuitized substrate according to one embodiment of the present invention. The process sequence starts with a substrate structure 21 illustrated in FIG. 1 in which two pair of conductor and PTH combinations 23 and 25 are depicted. This is representative only and not meant to limit the invention because many conductor and PTH combinations are possible when producing a circuitized substrate using the instant teachings. Importantly, each pair need only include a top conductor (27 for pair 23, 27' for pair 25) and one PTH (29 for pair 23 and 29' for pair 25 ) which extends through the thickness of dielectric substrate material 22. It is within the scope of this invention to include opposing conductors on both external surfaces of substrate material 22, such that one or more lower conductor(s) below the top conductor is(are) possible. However, in the broader aspects, it is only necessary to include a top conductor and PTH for the combination 23, which is also true for the second combination 25. It is also important to note that the conductor(s) and PTH(s) of each pair do not need to be positioned adjacent one another, as shown. The invention is able to provide a final substrate in which conductors and PTHs of different metals or metal alloys are possible at many locations on the top and/or bottom surface(s), spaced at varying distances from one another, depending on the desired final circuit structure for the end product. As indicated, it is also possible to include many more elements than one PTH and one conductor in each metal or metal alloy combination.

In one example, a total of as many as about 10,000 conductors 27/27' and about 30,000 PTHs 29/29' may be formed for a single substrate. As stated, the preferred dielectric substrate material 22 is comprised of fiberglass-reinforced epoxy resin, polytetrafluoroethylene, polyimide, polyamide, cyanate resin, photoimageable material, or possibly a combination of two or more of these materials. It is presently envisioned that the dielectric material 22 may also of ceramic or similar non-polymeric materials, or also of a thin, flexible dielectric material of much less thickness than conventional PCB substrate layers. One example is the afore-mentioned polyimide material, conventionally used in many "flex" substrates, while less often used in thicker conventional PCB substrates.

The method as defined herein is capable of providing same solder metallurgies on conductors and PTHs of at least two different metals or metal alloys, or, alternatively, depositing at least two different solders on conductors and PTHs of the same metal or metal alloy. In each method, a single commoning bar is used for both solder deposits, which are deposited in both situations using an electro-plating process. The following description with respect to FIGS. 1–13 will define the embodiment in which different conductor and PTH metal or metal alloys are used and the same solder is deposited on all. It is understood that the process defined is substantially identical for the situation where the conductors and PTHs are of the same metal or alloy and at least two different solder metallurgies are deposited, one on a first conductor-PTH pair and a different solder on a second conductor-PTH pair.

In FIG. 1, conductor 27 and PTH 29 of the first combination 23 are each of a metal alloy, which includes a base copper layer 31 having a combination of three metals in individual layers (only one representative layer 33 being shown for ease of illustration) positioned thereon. In a preferred embodiment, this preferred three-layered combination includes a nickel layer on top of base copper layer 31, a palladium layer on top of the nickel layer, and a gold layer on top of the palladium layer. The nickel layer is preferably about 50 to 300 micro-inches in thickness and formed by electroless plating. Electrolytic plating may also be used instead, as is also possible for other electroless plating operations defined herein. It is also within the scope of the invention to utilize electroless plating for one of the two solder plating processes and electrolytic plating for the other. The nickel layer acts as a copper diffusion barrier. The palladium layer is preferably about only 4 to 30 micro-inches in thickness and, like the nickel layer, is formed by electroless or electrolytic plating. This palladium layer acts as a wear resistance layer as well as forming a corrosion resistant surface. Finally, the gold layer is preferably about 1 to 10 micro-inches in thickness and is also formed by electrolytic or electroless plating. The gold layer enhances solderability and also functions to "seal" the palladium layer to prevent the palladium from attracting hydrocarbons that could form a contaminant film. In one example, the palladium layer is 99.9% pure, fine grained, equiaxed and possesses a hardness of about HK25 200–250 (Knoop hardness scale), while the gold layer is soft gold. Soft gold as used herein is preferably 99.9% pure gold with limitations on the type and quantity of impurities that are present in the remaining 0.1% of the material. In an alternative embodiment, this conductor and PTH can include the described base copper material, a nickel layer preferably about 50 to 300 micro-inches in thickness, and a gold layer preferably about 20 to 40 micro-inches in thickness, thus eliminating the palladium. If this case, both the nickel and gold layers, like those above, are formed using either electrolytic or electroless plating. The preferred gold for this combination is hard gold of at least 99.9% pure gold alloyed with up to 1000 parts per million of 99.0% cobalt and/or nickel to give the alloy a hardness of about HK25 130–260 (Knoop hardness scale). In yet another composition possibility for combination 23, only the nickel and palladium layers are added over the base copper. There are thus several metal or metal alloy composition possibilities for the first conductor-PTH combination 23 when used with the combination 25 also of this many possibilities (in addition to simply being of the base copper), but, as stated, of a different metal or alloy in the embodiment described in FIGS. 1–14. If a single metal or alloy is used for all conductors and PTHs, in accordance with the alternative embodiment of the invention, then this metal alloy is preferably selected from one of the five possible compositions taught above.

Second conductor-PTH combination 25, as stated, is of a different metal or metal alloy, albeit from the same group as above. Conductor 27' and PTH 29', in this example, are preferably simply of copper, illustrated by the numeral 41. Again it is considered worth mentioning that this second combination may include one or more lower conductors 27' on the opposite surface of substrate material 22, as well as many more PTHs 29' as part thereof, and that these may be positioned at varying spaces from one another depending on the required circuit pattern layout for the end product. It is again also mentioned that the PTHs used herein need not extend through the entire dielectric material 22 thickness but may instead be only partly formed therein to a prescribed depth. Combinations of both possibilities are also possible.

In a preferred embodiment, both pairs 23 and 25 are formed on material 22 using conventional circuit formation processing, a preferred one of these being photo-lithographic processing in which a copper base layer is formed and, in the case of combination 23, the added layers then plated. Photo-resist is then applied following which masking and development occurs in which the final combinations are defined. Such processing is known in the art and further description is not considered necessary. The PTHs are also formed using conventional manufacturing processes, including the described initial opening formation in the dielectric 22 using lasers or conventional drilling, following which is a plating operation in which the base copper and subsequent metal layers, if desired, are produced.

It is also within the scope of the invention to utilize a solder mask (not shown) on some of the Cu conductors. Should such a mask be used, it is preferably applied utilizing a screen coating process, followed by the photo-lithographic exposure and develop processing steps defined herein-below for the resist. In one example, this solder mask may be that sold under the product designation PSR4000 by Taiyo America Inc., Carson City, Nev. Such a mask, if used, is preferably only about 200 to 1200 micro-inches in thickness.). Other solder mask materials, if used, can be used to form the said solder mask layer, these including aqueous developed and non-aqueous developed polymeric layers.

Referring now to FIG. 2, a solder-wettable, conductive commoning layer 51 is deposited over all surfaces of the substrate, including the exposed surfaces of layer 22 and both conductor-PTH pairs on which solder is to be later applied. Known electroless plating processes and vacuum sputtering have been found suitable for depositing such a layer. In a preferred embodiment of the invention, this conductive commoning layer is of copper, but may be of another suitable metal or metal alloy. (While other materials such as gold, silver, noble metals and other conductive materials could be used in the practice of the invention, most good conductors other than copper would be relatively expensive and less conductive materials would also require a greater thickness applied, with consequent complication of the process.) In the preferred embodiment, commoning layer 51 is only from about 10 to about 30 micro-inches in thickness. In a most preferred example, this commoning layer is about 20 micro-inches thick. These dimensions are not limiting of the invention, however, as other thicknesses are possible without detracting from the advantageous features of the invention as defined herein. As understood from the teachings herein, commoning layer 51 provides the needed electrical coupling for both (and more if needed) of the separate solder plating processes on the two different metallurgies for the conductors and PTHs in the circuitized substrate. Copper is the preferred metal for commoning layer 51 because it is highly conductive and a relatively thin layer is sufficient for subsequent plating processes of the type mentioned herein. However, regardless of the material used for this commoning conductive layer, a sufficient thickness must be used to carry current for the plating without causing a voltage gradient in the conductive layer which would result in non-uniform of deposition or heating which might damage the resist applied as defined below. Use of copper, as stated, is further preferred because it enables formation of as thin as possible layer, assuring relatively low solubility of copper in most of the solder materials subsequently applied during the solder plating steps. "Pureness" of the resulting solder composition is thus assured as much as is believed possible given the technologies used.

To possibly improve adhesion of the commoning layer, it is possible to mechanically roughen (e.g., by pumice scrubbing) and/or chemically modify (e.g., with a suitable plasma or chemical treatment with alkaline permanganate or sulfuric-chromic acid solutions and the like) the surface of the exposed dielectric, the particular treatment being chosen to avoid damage to conductors or PTHs of particular metals, one such example being conductors and PTHs having gold as the outermost layer, as proposed above for one conductor-PTH combination.

In FIG. 3, a photo-resist (hereinafter referred to simply as resist) layer 53 is formed over all of the exposed conductive and dielectric surfaces, but preferably not within the PTH openings. (To avoid this, a known PTH "tenting" approach, described in greater detail below may be used). If a bottom series of conductors, as shown in FIGS. 1–14, are also to be soldered, as is possible using the teachings herein, a lower resist layer is also similarly formed. In one example, the resist layer is formed using vacuum application coating, followed by a known photo-lithographic exposure step, a known development step, and a known ultraviolet (UV) hardening process. In one example, the resist material is Morton 5000 Series photo-resist material, manufactured by Morton Thiokol, Tustin, Calif., and is preferably about 1000 to 4000 micro-inches in thickness. Aqueous processable solder resists are also preferred since these exhibit a reduced tendency to leave residues in PTH openings (if formed therein) which can interfere with plating and possibly form inclusions in the solder. In the preferred embodiments of this invention, each PTH is preferably plated to its entire depth with copper or of the copper-nickel-palladium-gold alloy of the required thickness and, in the case of the copper-nickel-palladium-gold conductor and PTH, to an almost identical thickness as the simple copper conductor and PTH combination for these combined metallurgies. For applications with respect to the PTHs, however, as mentioned, it is also possible (and often preferred) to use the aforementioned "tenting" of each PTH, in which a low viscosity liquid reinforcing material is first applied into the PTH and allowed to a depth even sufficient to "flow out" of the PTH. If such a reinforcing material is used, a dry film solder resist which naturally tents the PTH(s) may then be used to cover the PTH(s) and then be subjected to the described, following photo-lithographic processing.

In FIG. 4, the resist has been exposed and "developed" to the extent that the surfaces on conductor 27' and PTH 29' of combination 25 are uncovered, leaving the surface of the underlying commoning layer 51 and those of the opposite side corresponding conductor 27' and the substrate's exterior surfaces adjacent same exposed. Such exposure and development (including resist material removal) is achieved using conventional photo-lithographic processing. In FIG. 4, the developed resist layer is preferably removed using benzyl alcohol. Benzyl alcohol is used because it eliminates the possibility of galvanic corrosion between copper and non-copper metallic features (for example, formation of corrosion pits) or silvering (undercut of precious metal and/or subsequent flaking which can cause electrical shorts). Sodium or potassium hydroxide provide the strong electrolytes to promote the galvanic cell reactions. Halogenated organic resist strippers/removers may prove undesirable if environmental concerns exist.

In order to avoid a possible problem of excess copper in the solder material when applied in deposits of very small size, an additional step is preferred in the methodology discussed herein and represented in FIG. 5. Specifically, after the resist layer is applied, patterned and removed, the remaining substrate is treated in an immersion bath for a length of time sufficient for replacing substantially all the exposed copper with tin (preferred if a tin-lead solder is to be later applied) or other material which is a constituent of the intended solder alloy being plated. That is, any remaining trace amount of copper for which the solder constituent material is not substituted should be less than the amount of copper that can be readily dissolved in the solder material. Thus, the timing of this process may be empirically determined. No replacement of copper occurs at protected (unexposed) locations and the resulting deposits of tin or other solder constituent material remain electrically connected to each other and the source of electroplating current with a highly conductive copper grid as provided using the commoning layer 51. This "immersion" tin layer is represented by the numeral 55 in FIG. 5, but is not shown in further FIGS. for ease of illustration purposes.

Figure 6:
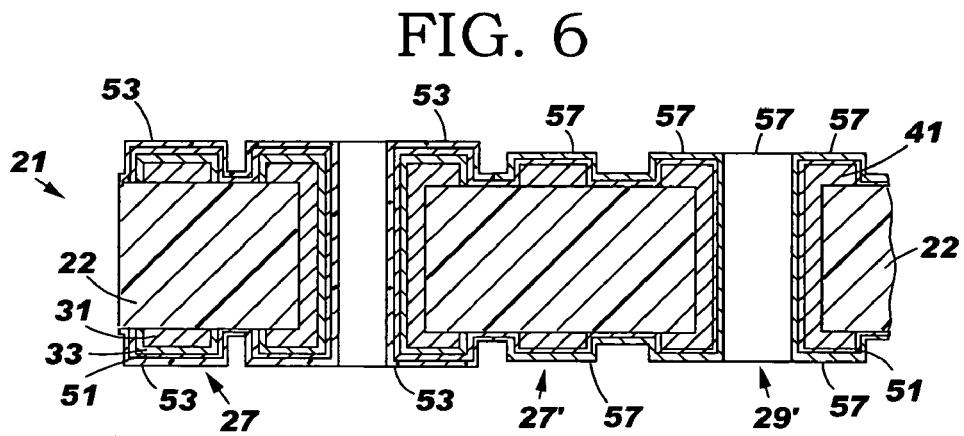

In FIG. 6, a first lead-tin solder layer 57 is formed on the exposed conductor 27' and PTH 29', using electrolytic plating. As stated, the necessary electrical connections needed for this process are provided utilizing the formed commoning layer 51. Lead-tin solder layer 57 is about 100 to 1000 micro-inches in thickness and, in one example, comprised of about 50 to 70 percent tin, with the balance lead. The defined under-layer of tin remains in place during this solder deposition. Preferred solder volumes for this first (and for the second solder platings described below) are generally in the range of from about 40 to about 70 cubic mils (0.000,000,040 to 0.000,000,070 cubic inches) on each conductor and PTH. These thicknesses may be different and are not meant to limit the invention. Other solder alloys such as tin-bismuth and lead indium and other combinations of electro-platable metals can be used. The electroplating process or processes are largely isotropic and thickness of the deposit is gradually built up from all conductor surfaces; thus allowing fine control of deposited solder volume within the volume coarsely defined by the apertures in the formed, respective resist layer. As stated, it is also possible to use lead-free solder at this and during the second deposition.

Figure 7:
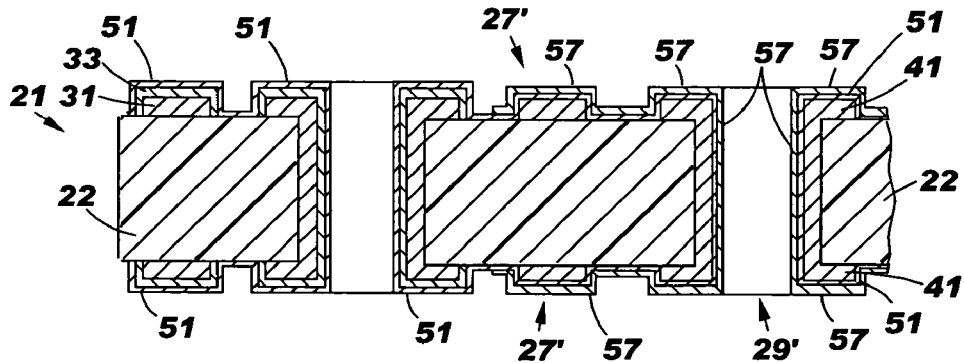
Figure 8:
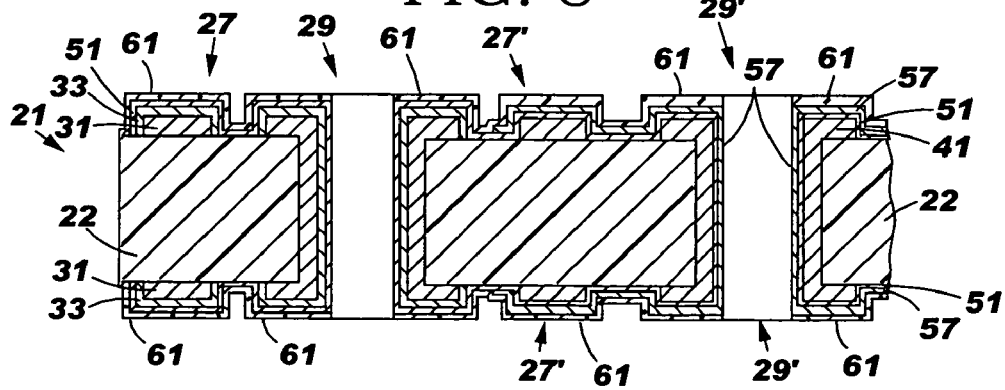
Figure 9:
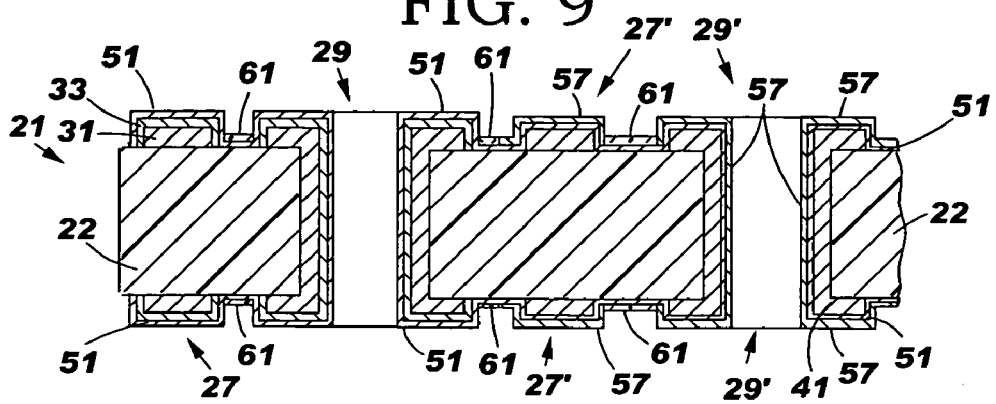

In FIG. 7, the resist 53 that was protecting the non-solder plated conductors 27 and PTHs 29 is now removed ("stripped"), preferably using the afore-mentioned benzyl alcohol solution. This now leaves these conductors and PTHs fully exposed, while the other conductors 27' and PTHs 29' have the first solder deposition in place. To protect this solder, and to define the remaining conductors and PTHs for the second solder deposition, a new layer of resist 61, preferably of the same composition of the resist 53, is applied over all of the external surfaces on both sides of the structure, as shown in FIG. 8. Then, in FIG. 9, the resist 61 is exposed and developed and removed to define the open surfaces of conductor 27 and PTH 29. The resist remains in place over the remaining surfaces, including those containing the original solder 57 deposits. As with resist 53, resist 61 does not extend within the PTHs, this material preferably being applied using the aforementioned "tenting" method of application.

Figure 10:
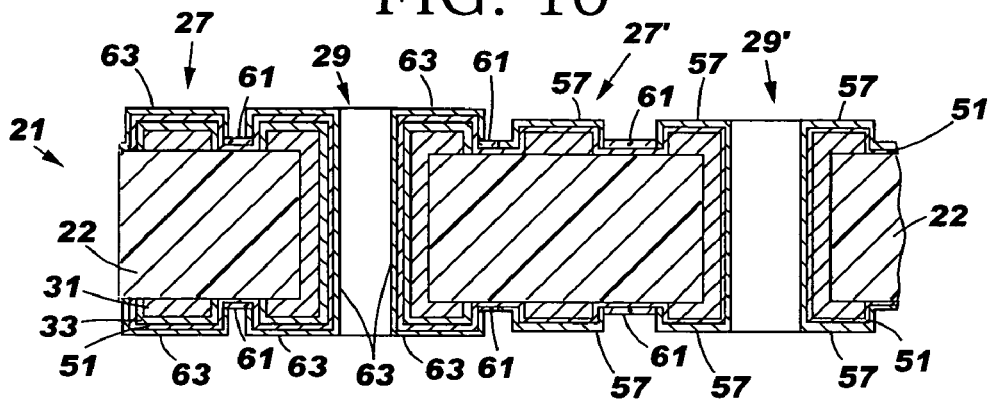
Figure 11:
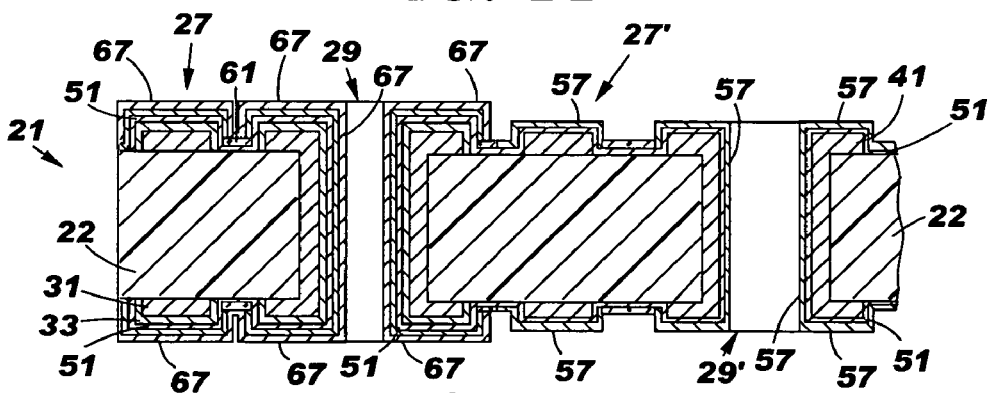

In FIG. 10, the structure, with only the conductor 27 and PTH 29 exposed, is now subjected to another immersion tin step similarly to that performed in FIG. 5 and for the same purpose. This tin layer is shown as numeral 63 in FIG. 10 only and not in further views for ease of illustration. A second solder material 67 (FIG. 11) is then applied, using preferably the same processing as used for the initial solder deposit applied in FIG. 6. For this FIG. 1–13 embodiment, this second solder, as indicated, is the same composition as the initial composition, so the same source can be provided, thus reducing costs and time in producing this layer. Similar thicknesses are also applied. As emphasized herein, the original and only commoning layer 51 is again used as part of this plating process, thereby eliminating the need for formation of a second layer or other complicated electrical coupling means such as a commoning bar used in some prior art processes. Surprisingly, this layer 51 remains of sufficient thickness and with needed integrity such that the desired plating is attained. That is, the layer 51 is so configured that it is fully connected to all conductive locations receiving the second plated solder 67 that a full, required depth of solder is applied.

Figure 12:
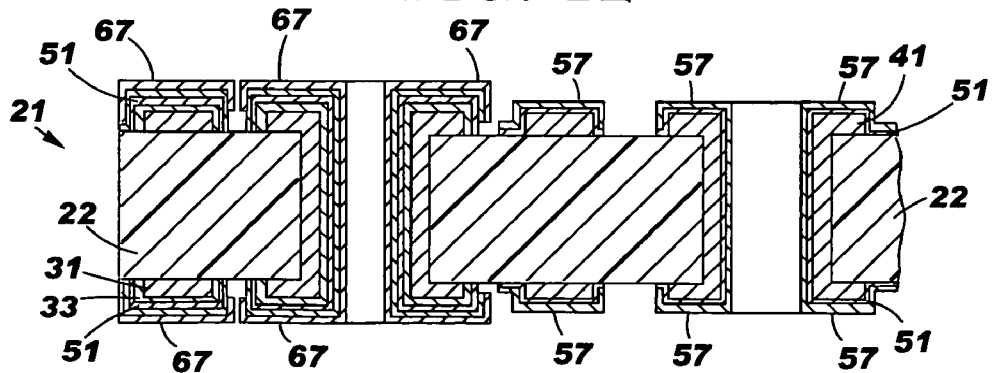

In FIG. 12, what remains of the second resist layer 61 is now removed in preferably the same manner as layer 53 in FIG. 4, following which any exposed portions of the commoning layer 51 are also removed, preferably with an ammoniated etchant solution used in the art for removing metal layers from substrates such as material 22. In this case, of course, some of the layer 51 may also be removed from an underlying conductive layer in some situations, but effective removal is nonetheless accomplished in an expeditious manner.

Figure 13:
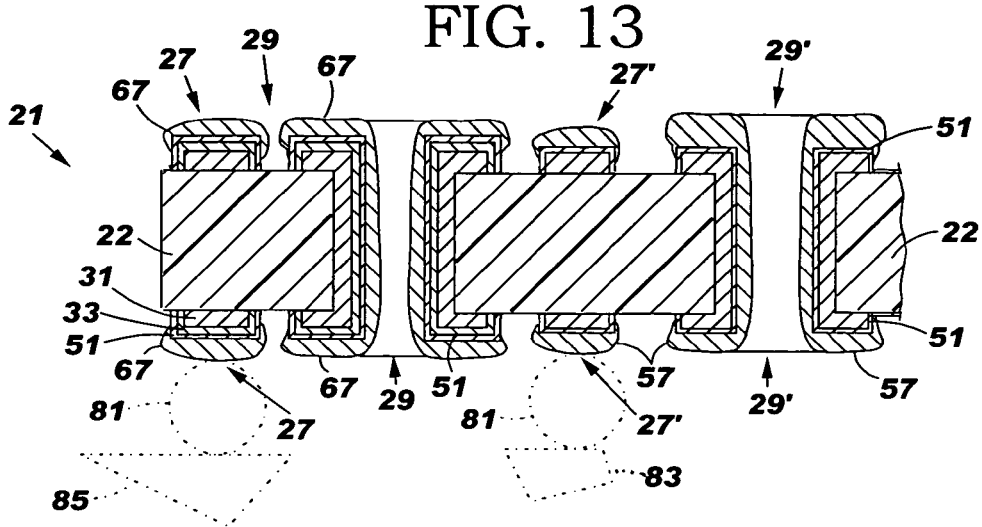

Finally, in FIG. 13, the structure, with all desired quantities of solder in place, is re-flowed (preferably by placing the structure of FIG. 13 in a solder reflow oven) to produced solder deposits of the rounded configurations shown. As indicated earlier, the solder over each of the top surfaces of the conductors 27 and 27' is preferably "dome shaped" to expedite subsequent coupling to an electrical conductor of an external electrical component such as a semiconductor chip, chip carrier, surface mount discrete component such as a resistor or capacitor, etc. In one embodiment, such external conductors may be solder balls 81 (phantom) as is known in the art. (These conductors are shown only on the bottom surface of the FIG. 13 structure but are understood to be on the upper surface also (e.g., on conductors 27 and 27') if the structure is to provide such dual side connections. If the FIG. 13 structure is a chip carrier substrate, then the upper solder balls may be those used to couple one or more semiconductor chips while those on the under surface are of solder compositions used for coupling substrates such as chip carrier substrates to an underlying, much larger PCB such as represented (in phantom) by the numerals 83 and 85. Re-flow is preferably conducted at temperatures within the range of from about 200 degrees Celsius (C.) to about 300 degrees C., and at peak temperature for a period of from about 0.05 minutes to about 0.50 minutes. These times and temperatures depend in part at least on the composition of the solders applied using the teachings herein as well as those of the solder balls (i.e., 81) used for the final couplings. Variations are thus well within the scope of the invention. It is desirable to reflow both of the upper and lower (and adjacent) plated solder deposits in FIG. 13 simultaneously prior to forming the eventual final solder connections between one or more of the external components 83, 85 and one or more (e.g., semiconductor chips, not shown) atop the FIG. 13 substrate. Application of heat to the substrate causes the solder deposits to melt and also causes minute portions of the underlying solder-wettable material (the copper or the copper-nickel-palladium-gold in the foregoing example) to be dissolved in the solder material. This action, whether such dissolution occurs or not, causes the solder material to form the illustrated shapes having a raised point substantially centered above each conductor, a very desirable feature, as mentioned, with respect to forming subsequent final solder connections with the electrical component(s). This "domed" shape greatly assists component conductor (e.g., a solder ball) registration and coupling during the re-flow process in which final coupling is attained. While such a domed shape may be desirable in many applications, however, some applications may require that the dome be flattened prior to forming a solder connection. Such a flattening procedure, e.g., using mechanical means, is also within the scope of the invention and readily possible herein.

It is also within the scope of the invention to provide a singular re-flow operation in which the external conductors are coupled, thus eliminating the need for a second separate re-flow operation following the initial re-flow process described above for just the solder depositions. While this is possible, it is still preferred to form the desired shapes for the solder, especially that above each of the conductors, to enhance positioning and final component conductor attachment. A singular re-flow, for example, would not enable the dome formation or subsequent flattening thereof, as is desirable for positioning closely spaced elements.

While the discussion herein has used various conductor and PTH metallurgies as examples of how to practice the invention, it is understood that other materials not already defined herein may be utilized. The invention is thus not limited to those defined herein. Further, while lead-tin solders are used in the description of the invention, it is also understood that other solder alloys can be used, one example being lead-free solders. The following Table represents various combinations of solder material compositions and corresponding conductor and PTH metals or metal alloys capable of being used in this invention. Clearly, the combination of solders and metals or alloys is extensive, especially considering several others than those shown are possible. The invention is thus not limited to this illustration.

TABLE

Possible Primary and Secondary Surface Finish Feature Combinations
(Inclusive But Not Restricted to the Following)

| Secondary Feature Finishes v | Primary Feature Finishes> | | | | | |
|---|---|---|---|---|---|---|
|  | Copper Only | Cu w/ Electrolytic Ni/Au | Cu w/ Electrolytic Ni/Pd | Cu w/ Electro-less Ni/Pd/Au | Cu w/ Electro-less Ni/Au | X (Other) Finishes |
| None | Yes | Yes | Yes | Yes | Yes | Yes |
| Solder Plate #1 Fused | Yes | Yes | Yes | Yes | Yes | Yes |
| Solder Plate #2 Fused | Yes | Yes | Yes | Yes | Yes | Yes |
| Solder Plate X Fused | Yes | Yes | Yes | Yes | Yes | Yes |
| Solder Plate #2 over 1 Fused | Yes | Yes | Yes | Yes | Yes | Yes |
| Solder Plate #X over 1 Fused | Yes | Yes | Yes | Yes | Yes | Yes |
| Solder Plate #X over 2 Fused | Yes | Yes | Yes | Yes | Yes | Yes |
| Solder Plate #X over 2 over 1 Fused | Yes | Yes | Yes | Yes | Yes | Yes |

(Note: Fused Solder Will Likely Remove Some of the Precious Metal Layer and Wet With Metal or Alloy (Underplate)

With respect to the above table, it is to be understood from the description herein that although the primary source of the solder composition (the tin and lead components) is from the electroplated solder, the ultimate solder composition will include further elements from the fusing operation such as by using infra-red (IR) or what is referred to as hot oil reflow. Accordingly, numerous resulting alloy compositions are possible using the unique teachings of the invention.

Figure 14:
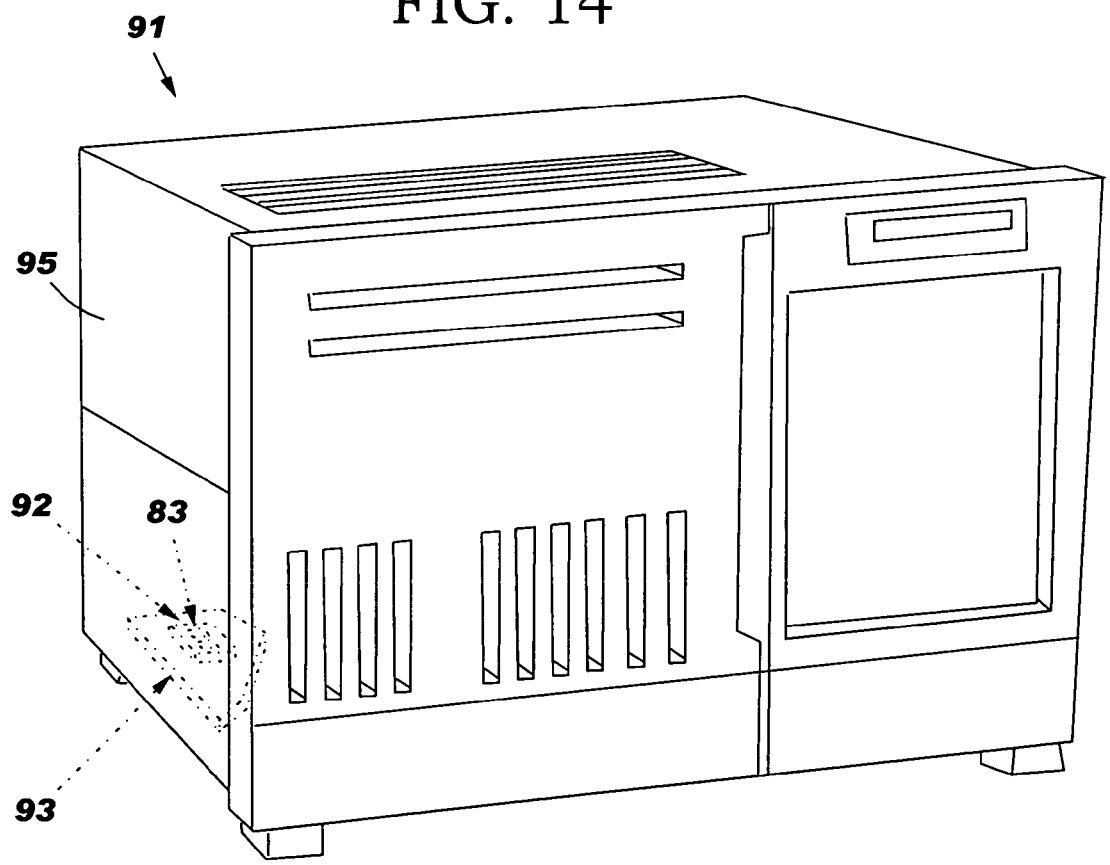
FIG. 14 illustrates an information handling system capable of using a circuitized substrate made using the teachings herein.

In FIG. 14, there is shown an information handling system 91 in accordance with one embodiment of the invention. System 91 may comprise a personal computer, mainframe computer, computer server, or the like, several types of which are well known in the art. System 91, as taught herein, is adaptable for including therein and thus as part thereof one or more of the circuitized substrates taught herein having electrical components thereon which form electrical assemblies as discussed above. In this form, the circuitized substrate (represented by numeral 92 ) may be the substrate for a PCB, a chip carrier, or similar assembly. Such an assembly is represented by the numeral 93 in FIG. 15 and is shown hidden, including having at least one (and preferably several) electrical components 83 as part thereof. Electrical coupling of assembly 93 to the system's circuitry is accomplished using conventional assembling processes, typically used when manufacturing today's computers, servers, etc. and further description is not believe needed. It is further added that the hidden assembly may also be mounted on still a larger PCB or other substrate, one example being a "motherboard" of much larger size, should such a board be required. (These components are shown hidden because these are encased within and thus behind a suitable housing 95 designed to accommodate the various electrical and other components which form part of system 91 ). Substrate 92, if such a "motherboard" in system 91, will typically further include many additional electrical assemblies, including additional printed circuit "cards" mounted thereon, such additional "cards" in turn also possibly including additional electronic components as part thereof. It is thus seen and understood that the electrical assemblies made in accordance with the unique teachings herein may be utilized in several various structures as part of a much larger system, such as information handling system 91. Further description is not believed necessary.

The present invention, as defined herein, overcomes many problems associated with electroplating operations. One such problem involves what is referred to as improper resist aperture aspect ratios. Specifically, as these apertures through which the plating solutions are to pass become too small, plating solution fluid flow and circulation may be impeded such that during the electroplating process, the transport of metal particles or ions occurs substantially only through diffusion. Without such circulation, the electroplating fluids in the aperture rapidly become depleted of the material being plated onto exposed portions of the underlying conductive layers such that the solder deposits may require extended processing and/or be unreliably formed. Reduced plating rate also limits the electroplating current which can be used without evolution of hydrogen through electrolysis and further displace plating solutions from the surfaces on with deposition is desired. Voids observed in the plated layer(s), even when plating times are extended may be attributable to this mechanism, as well. Increase of the bulk concentration of the plated material in the solution to increase the concentration gradient and the diffusion rate offers a form of solution, but unfortunately has occasionally been found to have a detrimental effect on plating thickness and volume uniformity. For example, a plating bath having a metal content of 20–40 grams/liter gives good plating uniformity (although such metal content may be varied considerably for different types of acid, additives and the like). However, if the metal content is doubled or tripled (while other constituents of the bath composition remain generally unchanged) in order to significantly alter the concentration gradient, substantial reduction of plating uniformity may occasionally result. Several agitation techniques are known which can marginally increase the concentration gradient, as well, but none have proven to be an effective correction for poor deposition uniformity in small apertures. For example, solution recirculation using such processes has proven to decrease the diffusion layer thickness and increase the concentration gradient by shear forces in the fluid. However, the limiting current is determined by the location of the lowest amount of shearing force (and lowest concentration gradient) in order to avoid evolution of hydrogen gas. The lowest amount of shearing force remains in the apertures. Further, localized variation in shear lead to localized differences in current density and plating thickness. Air sparging, which provides turbulence by blowing a gas, such as air, through the fluid has a similar action but suffers from loss of uniformity over large areas and the trapping of gas bubbles. Additionally, nitrogen must be used rather than air, at greatly increased cost, in the presence of divalent tin ions (if tin is used) due to the high rate of oxidation thereof to the quadravalent state which precipitates out of the fluid bath. Therefore, control of tin concentration in the bath and the deposited layer or alloy is substantially prevented. Cathode agitation in the plane of the deposition surface produces increased uniformity over large areas but is not considered sufficiently effective in high aspect ratio blind apertures where shearing force remains low. To avoid this problem, it has been found effective to use a combination of fluid jet agitation toward the deposition surface to produce turbulence at the deposition surface and cathode agitation in a plane generally perpendicular to the fluid flow. It is preferred to pump the plating fluid toward the deposition or plating surface through a plurality of small orifices in a manifold, known as a sparger, from a distance of only a few inches. Minimum amplitude of cathode agitation in relation to the spacing of jet orifices in the manifold is preferably such that each point on the panel being plated is impinged by a jet stream within about 0.25 inches directly opposite an orifice (e.g. an agitation stroke of about one-half inch less than orifice spacing in one or, preferably, both coordinate directions). Using such a sparger allows a current density of from about 15 to about 25 amperes per square foot of plated area with a bath concentration of 14–40 grams per liter total metals (tin plus lead, if only these metals are used for the solder being plated) and 250–350 grams per liter of free acid. This combination of conditions appears optimal from the standpoint of rapid material deposition while avoiding generation of hydrogen gas by electrolysis; providing good deposit uniformity and absence of voids, and, significantly, resulting in very high production yields, many closely approaching one-hundred percent.

While there have been shown and described what at present considered the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:
   providing a substrate including at least one dielectric layer selected from the group of materials consisting of fiberglass-reinforced epoxy resin, polytetrafluoroethylene, polyimide, polyamide, cyanate resin, photoimageable material, and combinations thereof;
   providing first and second conductors on said dielectric layer of said substrate and first and second PTHs within said dielectric layer of said substrate, said first conductor and said first PTH of a different metal or metal alloy than said second conductor and said second PTH;
   forming a conductive commoning layer on said substrate over said first and second conductors and PTHs and said dielectric layer;
   depositing a first quantity of solder material on said first conductor and said first PTH using an electro-plating process utilizing said commoning layer; and
   thereafter depositing a second quantity of solder material on said second conductor and said second PTH using an electro-plating process also utilizing said same commoning layer.

2. A method of making a circuitized substrate, said method comprising:
   providing a substrate including at least one dielectric layer;
   providing first and second conductors on said dielectric layer of said substrate and first and second PTHs within said dielectric layer of said substrate, said first conductor and said first PTH of the same metal or metal alloy as said second conductor and said second PTH;
   forming a conductive commoning layer on said substrate over said first and second conductors and PTHs and said dielectric layer;
   depositing a first quantity of solder material on said first conductor and said first PTH using an electro-plating process utilizing said commoning layer; and
   thereafter depositing a second quantity of solder material of a different metallurgy than said first quantity of solder on said second conductor and said second PTH using an electro-plating process also utilizing said same commoning layer.

3. The method of claim 2 wherein said dielectric layer is selected from the group of materials consisting of fiberglass-reinforced epoxy resin, polytetrafluoroethylene, polyimide, polyamide, cyanate resin, photoimageable material, and combinations thereof.

4. The method of claim 2 wherein said PTHs are initially formed using a laser or by mechanical drilling.

5. The method of claim 2 wherein said first and second conductors and said first and second PTHs are selected from the group of metals and metal alloys consisting of copper, copper-nickel, copper-nickel-palladium, copper-nickel-palladium-gold and combinations thereof.

6. The method of claim 2 wherein said commoning layer is formed using an electro-plating process.

7. The method of claim 6 wherein said electro-plating process is electroless plating.

8. The method of claim 6 wherein said commoning layer is copper or a copper alloy and is plated to a thickness of from about 10 microinches to about 30 microinches.

9. The method of claim 2 further including the step of removing part of said commoning layer following said depositing of said first quantity of solder material on said first conductor and said first PTH using said electro-plating process utilizing said commoning layer and prior to said depositing of said second quantity of solder material on said second conductor and said second PTH using said electro-plating process also utilizing said same commoning layer.

10. The method of claim 9 wherein said removing of said part of said commoning layer is accomplished using an etching process.

11. The method of claim 2 further including using photolithographic processing to provide a thin dielectric layer over said first and second conductors and said first and second PTHs and then removing selected portions of said thin dielectric layer to expose said first conductor and said first PTH prior to said depositing of said first quantity of said solder material on said first conductor and said first PTH using said electro-plating process utilizing said commoning layer.

12. The method of claim 11 further including using photolithographic processing to provide a second thin dielectric layer over said first and second conductors and said first and second PTHs and then removing selected portions of said second thin dielectric layer to expose said second conductor and said second PTH prior to said depositing of said second quantity of said solder material on said second conductor and said second PTH using said electro-plating process also utilizing said commoning layer.

13. The method of claim 12 further including removing said first and second thin dielectric layers subsequent to said depositing of said first and second quantities of solder material, respectively.

14. The method of claim 2 further including subjecting said first and second quantities of said solder materials to a re-flow process following said depositing thereof.

15. The method of claim 14 further including electrically connecting each of said re-flowed quantities of said solder materials on said first and second conductors and said first and second PTHs to a conductor of at least one electronic component to form an electrical assembly.

16. The method of claim 15 wherein said electrically connecting of said re-flowed quantities of said solder materials is accomplished utilizing a second re-flow process.

17. The method of claim 15 further including positioning said electrical assembly within an information handling system and electrically coupling said electrical assembly to the circuitry of said information handling system so that said electrical assembly is part of said information handling system.

18. A method of making a circuitized substrate, said method comprising:
providing a substrate including at least one dielectric layer;
providing first and second conductors on said dielectric layer of said substrate and first and second PTHs within said dielectric layer of said substrate, said first conductor and said first PTH of a different metal or metal alloy than said second conductor and said second PTH;
forming a conductive commoning layer on said substrate over said first and second conductors and PTHs and said dielectric layer;
depositing a first quantity of solder material on said first conductor and said first PTH using an electro-plating process utilizing said commoning layer; and
thereafter depositing a second quantity of solder material on said second conductor and said second PTH using an electro-plating process also utilizing said same commoning layer, said first conductor and said first PTH being selected from the group of metals and metal alloys consisting of copper, copper-nickel, copper-nickel-palladium, copper-nickel-palladium-gold and combinations thereof.

19. The method of claim 18 wherein said second conductor and said second PTI are selected from the group of metals and metal alloys consisting of copper, copper-nickel, copper-nickel-palladium, copper-nickel-palladium-gold and combinations thereof.

20. A method of making a circuitized substrate, said method comprising:
providing a substrate including at least one dielectric layer;
providing first and second conductors on said dielectric layer of said substrate and first and second PTHs within said dielectric layer of said substrate, said first conductor and said first PTH of a different metal or metal alloy than said second conductor and said second PTH;
forming a conductive commoning layer on said substrate over said first and second conductors and PTHs and said dielectric layer;
depositing a first quantity of solder material on said first conductor and said first PTH using an electro-plating process utilizing said commoning layer; and
thereafter depositing a second quantity of solder material on said second conductor and said second PTH using an electro-plating process also utilizing said same commoning layer, said first quantity of said solder material being of a different metallurgy than said second quantity of solder material.

21. The method of claim 20 wherein said PTHs are initially formed using a laser or by mechanical drilling.

22. The method of claim 20 wherein said commoning layer is formed using an electro-plating process.

23. The method of claim 22 wherein said electro-plating process is electroless plating.

24. The method of claim 22 wherein said commoning layer is copper or a copper alloy and is plated to a thickness of from about 10 microinches to about 30 microinches.

25. The method of claim 20 further including the step of removing part of said commoning layer following said depositing of said first quantity of solder material on said first conductor and said first PTH using said electro-plating process utilizing said commoning layer and prior to said depositing of said second quantity of solder material on said second conductor and said second PTH using said electro-plating process also utilizing said same commoning layer.

26. The method of claim 25 wherein said removing of said part of said commoning layer is accomplished using an etching process.

27. The method of claim 20 further including using photolithographic processing to provide a thin dielectric layer over said first and second conductors and said first and second PTHs and then removing selected portions of said thin dielectric layer to expose said first conductor and said first PTH prior to said depositing of said first quantity of said solder material on said first conductor and said first PTH using said electro-plating process utilizing said commoning layer.

28. The method of claim 27 further including using photolithographic processing to provide a second thin dielectric layer over said first and second conductors and said first and second PTHs and then removing selected portions of said second thin dielectric layer to expose said second conductor and said second PTH prior to said depositing of said second quantity of said solder material on said second conductor and said second PTH using said electro-plating process also utilizing said commoning layer.

29. The method of claim 28 further including removing said first and second thin dielectric layers subsequent to said depositing of said first and second quantities of solder material, respectively.

30. A method of making a circuitized substrate, said method comprising:
    providing a substrate including at least one dielectric layer;
    providing first and second conductors on said dielectric layer of said substrate and first and second PTHs within said dielectric layer of said substrate, said first conductor and said first PTH of a different metal or metal alloy than said second conductor and said second PTH;
    forming a conductive commoning layer on said substrate over said first and second conductors and PTHs and said dielectric layer;
    depositing a first quantity of solder material on said first conductor and said first PTH using an electro-plating process utilizing said commoning layer; and thereafter depositing a second quantity of solder material on said second conductor and said second PTH using an electro-plating process also utilizing said same commoning layer, said first quantity of said solder material being of substantially the same metallurgy as said second quantity of solder material.

31. The method of claim 30 wherein said PTHs are initially formed using a laser or by mechanical drilling.

32. The method of claim 30 wherein said commoning layer is formed using an electro-plating process.

33. The method of claim 32 wherein said electro-plating process is electroless plating.

34. The method of claim 32 wherein said commoning layer is copper or a copper alloy and is plated to a thickness of from about 10 microinches to about 30 microinches.

35. The method of claim 30 further including the step of removing part of said commoning layer following said depositing of said first quantity of solder material on said first conductor and said first PTH using said electro-plating process utilizing said commoning layer and prior to said depositing of said second quantity of solder material on said second conductor and said second PTH using said electro-plating process also utilizing said same commoning layer.

36. The method of claim 35 wherein said removing of said part of said commoning layer is accomplished using an etching process.

37. The method of claim 30 further including using photolithographic processing to provide a thin dielectric layer over said first and second conductors and said first and second PTHs and then removing selected portions of said thin dielectric layer to expose said first conductor and said first PTH prior to said depositing of said first quantity of said solder material on said first conductor and said first PTH using said electro-plating process utilizing said commoning layer.

38. The method of claim 37 further including using photolithographic processing to provide a second thin dielectric layer over said first and second conductors and said first and second PTHs and then removing selected portions of said second thin dielectric layer to expose said second conductor and said second PTH prior to said depositing of said second quantity of said solder material on said second conductor and said second PTH using said electro-plating process also utilizing said commoning layer.

39. The method of claim 38 further including removing said first and second thin dielectric layers subsequent to said depositing of said first and second quantities of solder material, respectively.

40. A method of making a circuitized substrate, said method comprising:
    providing a substrate including at least one dielectric layer;
    providing first and second conductors on said dielectric layer of said substrate and first and second PTHs within said dielectric layer of said substrate, said first conductor and said first PTH of a different metal or metal alloy than said second conductor and said second PTH;
    forming a conductive commoning layer on said substrate over said first and second conductors and PTHs and said dielectric layer;
    depositing a first quantity of solder material on said first conductor and said first PTH using an electro-plating process utilizing said commoning layer;
    thereafter depositing a second quantity of solder material on said second conductor and said second PTH using an electro-plating process also utilizing said same commoning layer; and
    subjecting said first and second quantities of said solder materials to a re-flow process following said depositing thereof.

41. The method of claim 40 further including electrically connecting each of said re-flowed quantities of said solder materials on said first and second conductors and said first and second PTHs to a conductor of at least one electronic component to form an electrical assembly.

42. The method of claim 41 wherein said electrically connecting of said re-flowed quantities of said solder materials is accomplished utilizing a second re-flow process.

43. The method of claim 41 further including positioning said electrical assembly within an information handling system and electrically coupling said electrical assembly to the circuitry of said information handling system so that said electrical assembly is part of said information handling system.

44. The method of claim 40 wherein said PTHs are initially formed using a laser or by mechanical drilling.

45. The method of claim 40 wherein said commoning layer is formed using an electro-plating process.

46. The method of claim 45 wherein said electro-plating process is electroless plating.

47. The method of claim 45 wherein said commoning layer is copper or a copper alloy and is plated to a thickness of from about 10 microinches to about 30 microinches.

48. The method of claim 40 further including the step of removing part of said commoning layer following said depositing of said first quantity of solder material on said first conductor and said first PTH using said electro-plating process utilizing said commoning layer and prior to said depositing of said second quantity of solder material on said second conductor and said second PTH using said electro-plating process also utilizing said same commoning layer.

49. The method of claim 48 wherein said removing of said part of said commoning layer is accomplished using an etching process.

50. The method of claim 40 further including using photolithographic processing to provide a thin dielectric layer over said first and second conductors and said first and second PTHs and then removing selected portions of said thin dielectric layer to expose said first conductor and said first PTH prior to said depositing of said first quantity of said solder material on said first conductor and said first PTH using said electro-plating process utilizing said commoning layer.

51. The method of claim 50 further including using photolithographic processing to provide a second thin dielectric layer over said first and second conductors and said first and second PTHs and then removing selected portions of said second thin dielectric layer to expose said second conductor and said second PTH prior to said depositing of said second quantity of said solder material on said second conductor and said second PTH using said electro-plating process also utilizing said commoning layer.

52. The method of claim 51 further including removing said first and second thin dielectric layers subsequent to said depositing of said first and second quantities of solder material, respectively.

* * * * *

UNITED STATES PATENT AND TRADEMARK OFFICE
CERTIFICATE OF CORRECTION

PATENT NO. : 7,087,441 B2
APPLICATION NO. : 10/968929
DATED : August 8, 2006
INVENTOR(S) : J. Konrad et al.

Page 1 of 1

It is certified that error appears in the above-identified patent and that said Letters Patent is hereby corrected as shown below:

Col. 20, Claim 19 – line 25 – delete "PTI" and insert --PTH--

Col. 21, Claim 30 – line 37 – delete -

"depositing a first quantity of solder material on said first conductor and said first PTH using an electroplating process utilizing said commoning layer; and thereafter depositing a second quantity of solder material on said second conductor and said second PTH using an electroplating process also utilizing said same commoning layer, said first quantity of said solder material being of substantially the same metallurgy as said second quantity of solder material."

and insert

--depositing a first quantity fo solder material on said first conductor and said first PTH using an electroplating process utilizing said commoning layer; and thereafter depositing a second quantity of solder material on said second conductor and said second PTH using an electroplating process also utilizing said same commoning layer, said first quantity of said solder material being of substantially the same metallurgy as said second quantity of solder material.--

Signed and Sealed this

Fifth Day of December, 2006

JON W. DUDAS
*Director of the United States Patent and Trademark Office*